US010396047B2

(12) United States Patent
Ong et al.

(10) Patent No.: US 10,396,047 B2
(45) Date of Patent: Aug. 27, 2019

(54) SEMICONDUCTOR PACKAGE WITH PACKAGE COMPONENTS DISPOSED ON A PACKAGE SUBSTRATE WITHIN A FOOTPRINT OF A DIE

(71) Applicant: Intel Corporation, Santa Clara, CA (US)

(72) Inventors: Jenny Shio Yin Ong, Bayan Lepas (MY); Bok Eng Cheah, Gelugor (MY); Jackson Chung Peng Kong, Penang (MY); Seok Ling Lim, Kulim (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/977,617

(22) Filed: May 11, 2018

(65) Prior Publication Data

US 2018/0366423 A1 Dec. 20, 2018

(30) Foreign Application Priority Data

Jun. 14, 2017 (MY) .......................... PI 2017702192

(51) Int. Cl.

| | |
|---|---|
| ***H01L 29/00*** | (2006.01) |
| ***H01L 23/64*** | (2006.01) |
| ***H01L 23/538*** | (2006.01) |
| ***H01L 23/552*** | (2006.01) |
| ***H01L 23/498*** | (2006.01) |

(52) U.S. Cl.

CPC ...... *H01L 23/645* (2013.01); *H01L 23/49816* (2013.01); *H01L 23/5384* (2013.01); *H01L 23/552* (2013.01); *H01L 23/642* (2013.01); *H01L 2224/16225* (2013.01); *H01L 2924/15174* (2013.01); *H01L 2924/15311* (2013.01); *H01L 2924/19106* (2013.01)

(58) Field of Classification Search

CPC ............. H01L 23/645; H01L 23/49816; H01L 23/5384; H01L 23/552; H01L 23/642

USPC .......................................................... 257/531

See application file for complete search history.

(56) References Cited

U.S. PATENT DOCUMENTS 7,378,733 B1 * 5/2008 Hoang .................... H01L 23/50 257/724

2004/0238857 A1 * 12/2004 Beroz ................ H01F 17/0033 257/232

* cited by examiner

*Primary Examiner* — Tu-Tu V Ho

(74) *Attorney, Agent, or Firm* — Schwabe, Williamson & Wyatt, P.C.

(57) ABSTRACT

Embodiments of the present disclosure provide a semiconductor package configured to provide for a disposition of one or more package components on a substrate within a footprint of a package die. In embodiments, the package may include a package substrate having a first side and a second side opposite the first side. An area of the first side of the package substrate within which a die is to be disposed may form a footprint of the die on the substrate. The package may further include a voltage reference plane coupled with the second side of the package substrate. At least a portion of the voltage reference plane may be disposed within the die footprint, to provide a reference voltage to components to be disposed within the footprint on the second side of the substrate, and to shield these components from electromagnetic interference. Other embodiments may be described and/or claimed.

22 Claims, 13 Drawing Sheets

SEMICONDUCTOR PACKAGE WITH PACKAGE COMPONENTS DISPOSED ON A PACKAGE SUBSTRATE WITHIN A FOOTPRINT OF A DIE

CROSS REFERENCE TO RELATED APPLICATIONS

The present application claims international priority under 35 U.S.C. § 119 to co-pending Malaysian Patent Application No. PI 2017702192, filed Jun. 14, 2017, entitled "A SEMICONDUCTOR PACKAGE WITH PACKAGE COMPONENTS DISPOSED ON A PACKAGE SUBSTRATE WITHIN A FOOTPRINT OF A DIE", the entire content and disclosure of which is hereby incorporated by reference in its entirety.

FIELD

Embodiments of the present disclosure generally relate to the field of semiconductor package fabrication and in particular to techniques for providing packages with a reduced form factor and improved power integrity performance.

BACKGROUND

Currently employed techniques for the semiconductor package fabrication may experience form-factor constraints associated with a higher degree of device integration into a package substrate. For example, sizable air core inductor (ACI) structures may be required for the full integration of a voltage regulator with other active components (e.g., a central processing unit (CPU)) on-die. Such technology, known as a fully integrated voltage regulator (FIVR) may be used to improve and/or replace the often used voltage regulation functionality through bulky and costly on-board devices such as inductors, capacitors and integrated circuit controllers.

The implementation of FIVR (at the silicon level) and ACI (in the package substrate) may result in the enlargement of the keep-out zone of the ball grid array (BGA) in order to ensure robust functionality of the package, e.g., in order to reduce electromagnetic interference or unwanted coupling. Accordingly, the package land side footprint for BGA input/output (I/O) and/or passive components placement may be limited.

Current solutions to accommodate the FIVR/ACI integration may include passive component count reduction and/or adoption of miniaturized components, which may affect device performance and increase package bill of materials (BOM) costs. Current solutions may also involve enlarging package size to accommodate required passive (or active) components, to enable continuous device bandwidth and I/O scaling. However, such solutions may incur package BOM cost increases and further result in an increase of the overall size of the package, which may negatively impact form-factor requirements.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
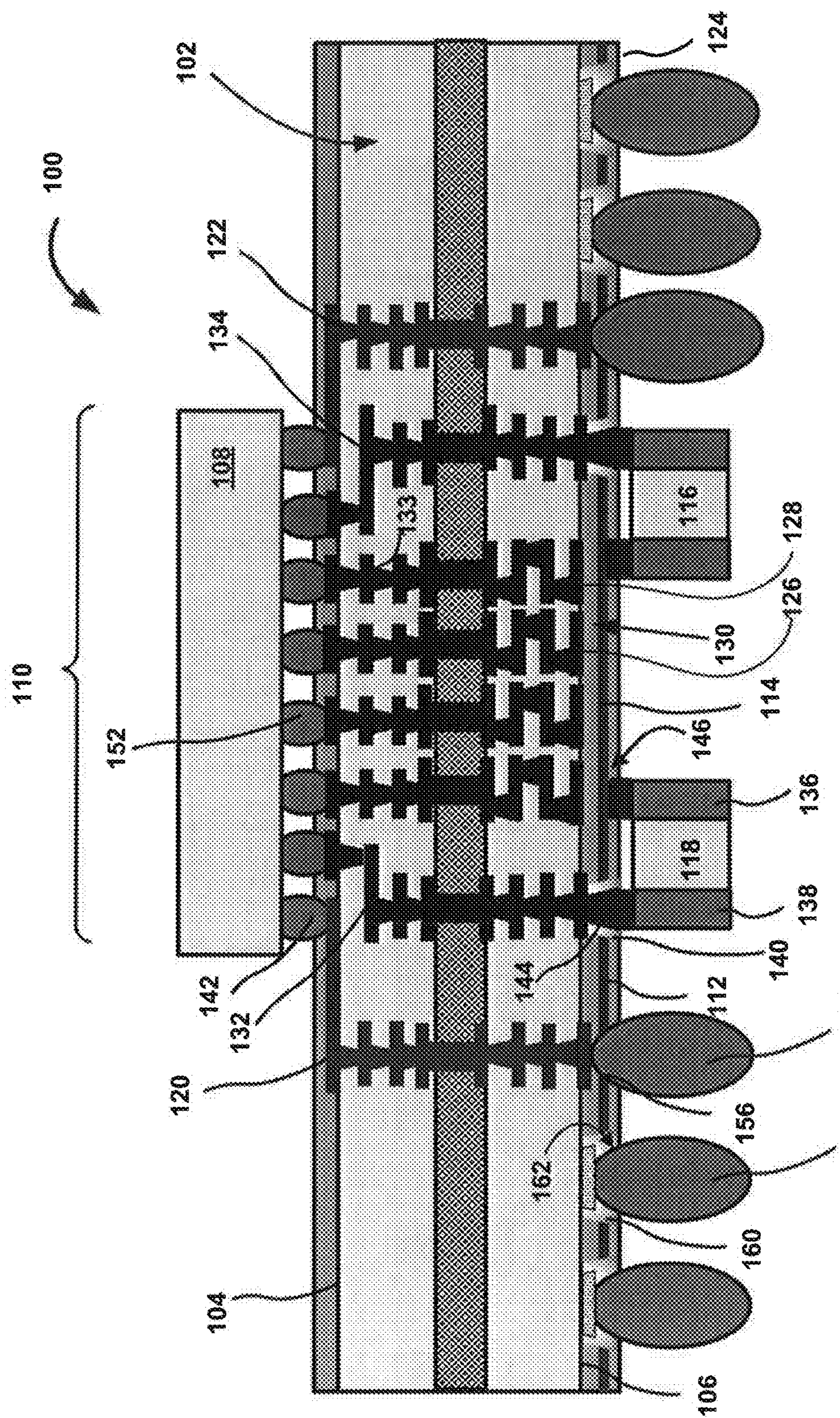
FIGS. 1-2 illustrate cross-sectional and bottom views of an example system comprising a semiconductor package configured to provide for a disposition of one or more package components on a package substrate within a footprint of a package die, in accordance with some embodiments.

Embodiments of the present disclosure include techniques and configurations for a semiconductor package configured to provide for a disposition of one or more package components on a package substrate within a footprint of a package die. In embodiments, the semiconductor package may include a package substrate having a first side and a second side opposite the first side. An area of the first side of the package substrate within which a die is to be disposed may form a footprint of the die on the substrate. The semiconductor package may further include a voltage reference plane coupled with the second side of the package substrate. At least a portion of the voltage reference plane may be disposed within the footprint of the die, to provide a reference voltage to one or more components to be disposed within the footprint of the die on the second side of the substrate, and to shield these components from electromagnetic interference.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. “Coupled” may mean that two or more elements are in direct physical, electrical, or optical contact. However, “coupled” may also mean that two or more elements indirectly contact each other, but yet still cooperate or interact with each other, and may mean that one or more other elements are coupled or connected between the elements that are said to be coupled with each other. The term “directly coupled” may mean that two or more elements are in direct contact.

Figure 2:
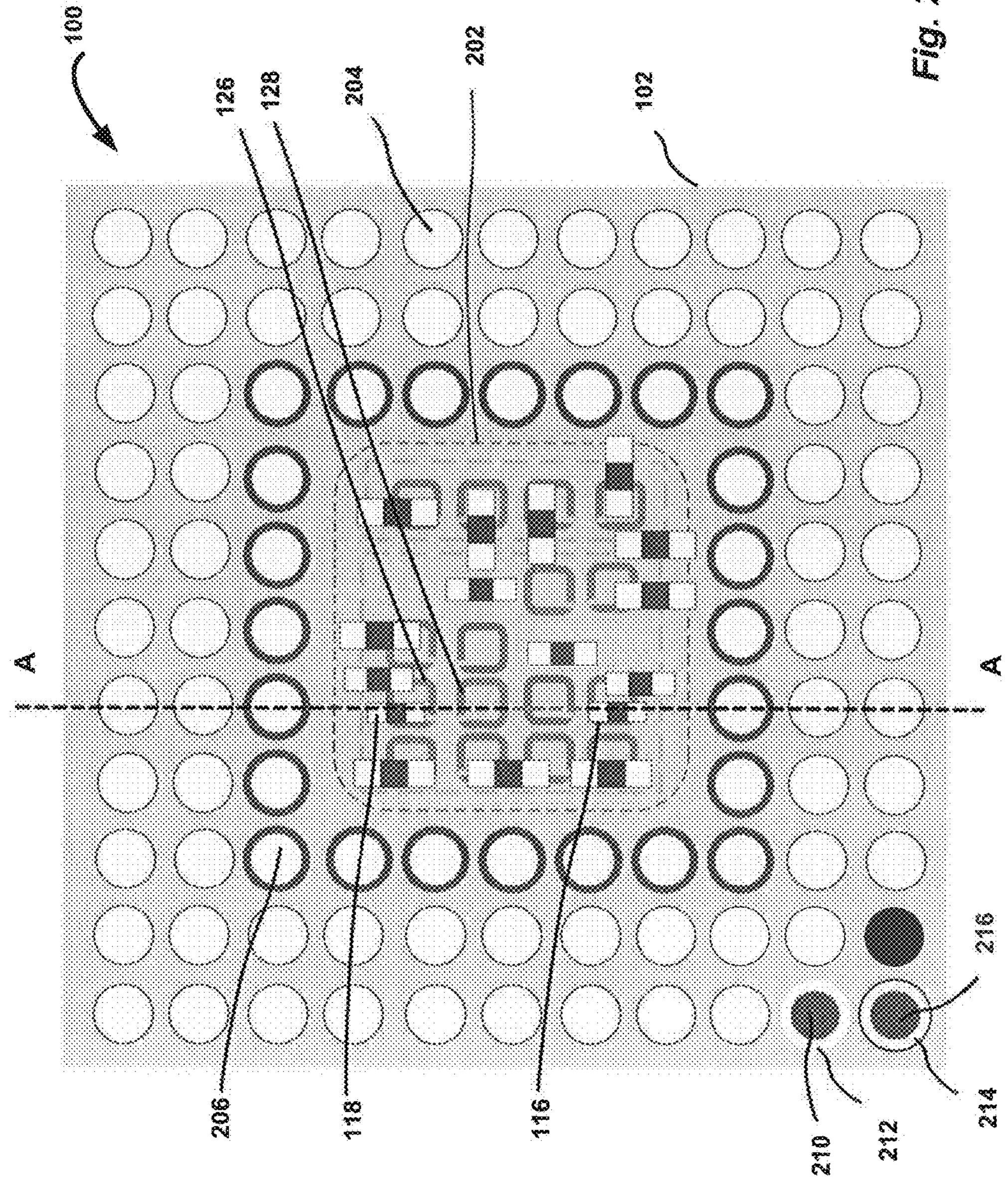

FIGS. 1-2 illustrate cross-sectional and bottom views of an example system comprising a semiconductor package configured to provide for a disposition of one or more package components on a package substrate within a footprint of a package die, in accordance with some embodiments. More specifically, FIG. 1 illustrates a cross-sectional view of the semiconductor package 100 along the cross-section A-A shown in FIG. 2. FIG. 2 illustrates the bottom view of the semiconductor package 100. For ease of understanding, like components of FIGS. 1 and 2 are indicated by like numerals.

The semiconductor package 100 may include a package substrate 102 having a first (top) side 104 and a second (bottom) side 106 opposite the first side 104. A silicon die 108 may be disposed on the first side 104, within a footprint 110 allocated for the disposition of the die 108 on the first side 104 of the package substrate 102. In embodiments, the die 108 may comprise one or more of: a central processing unit (CPU), a platform controller hub (PCH), an embedded dynamic random access memory (eDRAM), a field programmable gate array (FPGA), or any other integrated circuit component.

In embodiments, the semiconductor package 100 may include a voltage reference plane 112 disposed on (coupled with) the second (bottom) side 106 of the package substrate 102. At least a portion 114 of the voltage reference plane 112 may be disposed within the footprint 110 of the die 108 (e.g., under the die 108 shadow region), as shown. The voltage reference plane 112 may provide a reference voltage to one or more components 116, 118 disposed on the second side 106 of the substrate 102 (also shown in FIG. 2), thus enabling the disposition of the components 116, 118 within the footprint 110 (under the shadow) of the die 108 and providing electromagnetic shielding for the components 116, 118. In embodiments, the components 116, 118 may comprise passive or active components. In the example embodiment of FIGS. 1 and 2, the components 116, 118 comprise passive components, such as decoupling capacitors. In embodiments, components 116, 118 may comprise integrated circuits (IC), or discrete components of different types, such as capacitors, inductors, resistors, or other types of electric components.

In embodiments, the voltage reference plane 112 may be embedded in a dielectric layer 124 (e.g., solder resist), which may be disposed on the second side 106 of the package substrate 102, as shown. The reference voltage, e.g., Vss (ground reference voltage) or Vcc (power reference voltage) may be generated by the die 108 and provided to the reference plane 112 via one or more conductive paths 120, 122. As shown, the conductive paths 120, 122 may extend between the sides 104 and 106 of the substrate 102 into the dielectric layer 124, to electrically couple with the voltage reference plane 112 and provide the reference voltage to the voltage reference plane 112. In embodiments, the conductive paths 120, 122 may be disposed outside of the footprint 110, as shown.

The package substrate 102 may further include one or more air core inductor (ACI) structures 126, 128 (four ACI structures are shown in FIG. 1 for purposes of illustration and do not limit this disclosure). The ACI structures 126, 128 may be disposed inside the package substrate 102 within the footprint 110 (under the shadow) of the die 108, as shown in FIGS. 1 and 2. The ACI structures 126, 128 may extend substantially between the first and second sides 104, 106 of the substrate 102. For purposes of illustration, the ACI structures 126, 128 are shown as formed adjacent to the side 106 of the package substrate 102. In embodiments, the ACI structures 126, 128 may be formed adjacent to the first side 104. The ACI structures 126, 128 may be isolated from the voltage reference plane 112 with a portion 130 of the dielectric layer 124. As shown, the portion 130 of the dielectric layer 124 may be provided between the voltage reference plane 112 and the second side 106 of the package substrate 102, to provide the isolation of the ACI structures 126, 128 from the voltage reference plane 112. The placement of the ACI structures 126, 128 within the footprint 110 of the die 108 and isolation of electromagnetic interference and unwanted noise coupling (e.g., between ACI structures 126, 128 and components 116, 118) through the voltage reference plane 112 may improve the efficiency of the FIVR technology and overall device performance.

In embodiments, the package substrate 102 may further include one or more conductive paths (traces) 132, 134 disposed between the first and second sides 104, 106 of the substrate 102 within the footprint 110 of the die 108 to provide another reference voltage generated by the die 108 to the components 116, 118 disposed on the second side 106 of the substrate 102 within the footprint 110 of the die 108. The reference voltage may include voltage Vss or Vcc. For example, the conductive paths 120, 122 may provide Vss to the reference plane 112, and the conductive paths 132, 134 may provide Vcc to the components 118, 116 (or vice versa). (Vcc paths 133, e.g., metal via/routing may connect the die 108 and ACI structures 126, 128 for power routing.) Accordingly, the respective terminals of the components 116, 118 may be electrically coupled with respective reference voltages Vss and Vcc. For example, the terminal 136 of the component 118 may be coupled to Vss provided by the voltage reference plane 112, and the terminal 138 of the component 118 may be coupled to Vcc provided by the conductive path 132. As shown, the conductive paths 132, 134 may extend to a side of the dielectric layer 124 that is disposed on (attached to) the second side 106 of the substrate 102. In other words, the conductive paths 132, 134 may extend to the portion 130 of the layer 124. The conductive paths 132, 134 may be isolated from the voltage reference plane 112. For example, the path 132 may be isolated from the voltage reference plane 112 with an insulator, such as dielectric material 140.

Thus, a first terminal of the passive component e.g., land side capacitor 118, may be coupled to the embedded reference plane 112 that extends over the ACI structures 126, 128 through a Vss pad opening 146 and solder connection. A second terminal of the passive component 118 may be coupled to a reference voltage having an opposite polarity to the first terminal (e.g., Vcc/power reference voltage) through a Vcc pad opening 144 and corresponding solder connection. The Vcc terminal solder connection may be isolated from the embedded Vss reference plane 112 through dielectric material (layer 140) on the sidewall of the Vcc solder resist pad opening 144. In a similar manner, the signal BGA and Vcc/power BGA may be isolated from the Vss embedded reference plane 112 through the dielectric layer 124. The embedded Vss reference plane 112 may be coupled to the Vss BGAs through direct contact between a connector (e.g., solder ball) 154 and portions of the embedded Vss metal plane 112 at the sidewall of the Vss solder resist BGA pad opening 156.

The active layer of the silicon die 108 may be electrically coupled to the components embedded or attached (e.g., ACI structures 126, 128 or decoupling capacitors 116, 118) to the package substrate 102 via connectors 142, 152 (e.g., solder bumps) as well as via package traces and vertical interconnects, e.g., micro-vias and/or plated through hole (PTH) structures that comprise the conductive paths 120, 122, 132, and 134.

In summary, the ACI structures of the package 100 may be coupled to the Vcc or power voltage source of the device. A layer 124 of solder resist with embedded voltage reference plane 112 may be attached to the surface of the second side 106 of the package substrate 102. The embedded voltage reference plane 112 (having a metal thickness ranging from 5 μm to 15 μm) within the solder resist may be coupled to a reference voltage, e.g., Vss/ground reference voltage, through one or more connectors 142, 152 electrically coupled to the source of Vss/ground reference voltage. The voltage reference plane 112 may extend across the ACI structures 126, 128 disposed adjacent the second side 106 of the package substrate 102, as shown. The voltage reference plane 112 disposed within the solder resist layer 124 as described above may prevent the electromagnetic (EMI) and/or radio-frequency interference (RFI) coupling effects between the ACI structures 126, 128 and components 116, 118, hence allowing the real estate below the ACI structures 126, 128 to be utilized. For example, the disposition of the voltage reference plane 112 in the package 100 according to the described embodiments may allow for placement of active or passive components (such as capacitors) 116, 118 within the footprint 110, thus contributing to overall ACI keep-out zone (KOZ) area reduction. The reduced ACI KOZ 202 (shown in FIG. 2 with a dashed line) may provide for overall package form-factor reduction and/or increase BGA I/O density. For example, with reference to FIG. 2, in addition to BGA 204 that may be typically disposed on the package 100, additional BGA 206 (with thicker outline) may be disposed on the package 100, due to the KOZ 202 reduction.

The package 100 may further include connectors (e.g., solder balls 154, 158) disposed on the side 106 of the substrate 102. The connectors 154, 158 may form a ball grid array (BGA). In some embodiments, the connectors 154, 158 may comprise a stud grid array (SGA), a land grid array (LGA), a mezzanine, or any other type of a connector. Some of the connectors (e.g., solder ball 158) may be isolated from the reference plane 112 by a dielectric material 160 applied to side walls of a pad opening 162. As shown in more detail in FIG. 2, the Vcc BGA pad (or signal pad) 210 may be surrounded by a dielectric layer 212, to isolate the pad 210 from the voltage reference plane 112, part of which is indicated by numeral 214. The voltage reference plane 214 may be electrically connected with a Vss BGA pad 216, as shown.

In summary, the described embodiments of a package having package components disposed on a package substrate within a footprint of a package die may provide for the package form-factor miniaturization and/or increased BGA I/O density through reduction of an air core inductor keep-out zone on a package substrate land side. The described embodiments may further provide for improved power integrity performance through shorter decoupling loop inductance and/or increased land side decoupling capacitor density under the die shadow region. The described embodiments may also provide for improved electromagnetic (EMI) and radio-frequency interference (RFI) shielding or noise coupling among sensitive components, e.g., crystal clock signal and FIVR/ACI, which may also contribute to improved signal integrity performance.

FIGS. 3-11 illustrate an example operation flow to form a system comprising a semiconductor package with embedded voltage reference plane, in accordance with some embodiments. As described in reference to FIGS. 1-2, the semiconductor package with an embedded voltage reference plane may provide for a disposition of one or more package components on a package substrate within a footprint of a package die.

Figure 3:
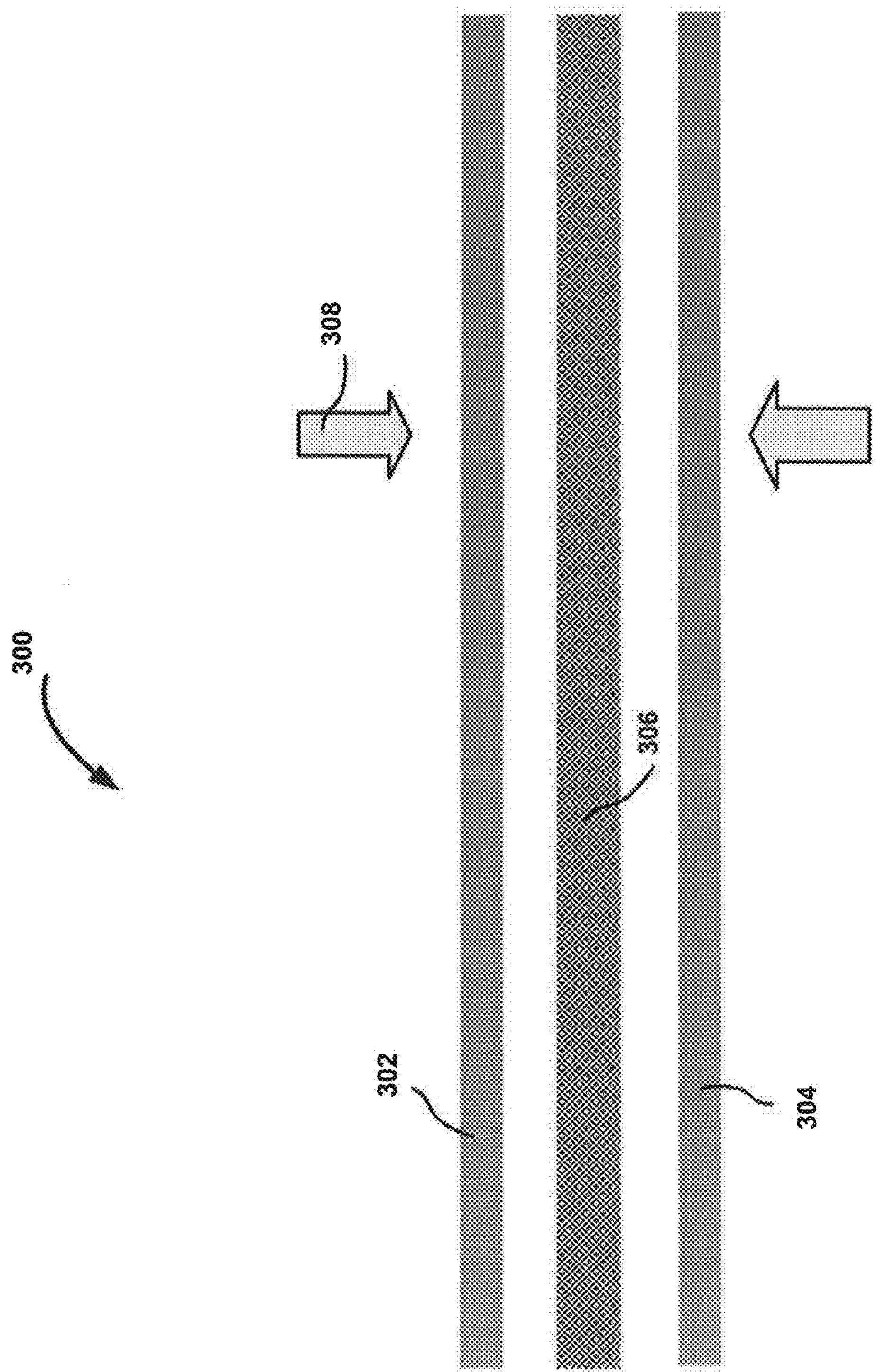
FIGS. 3-11 illustrate an example operation flow to form a system comprising a semiconductor package with embedded voltage reference plane, in accordance with some embodiments.

FIG. 3 illustrates the example system after a package core layer for the semiconductor package has been formed. As shown, metal (copper) foil 302, 304 may be adhered on a core layer (e.g., woven glass layer) 306 of a package 300. This may be done via hot-press and lamination process 308, for example.

Figure 4:
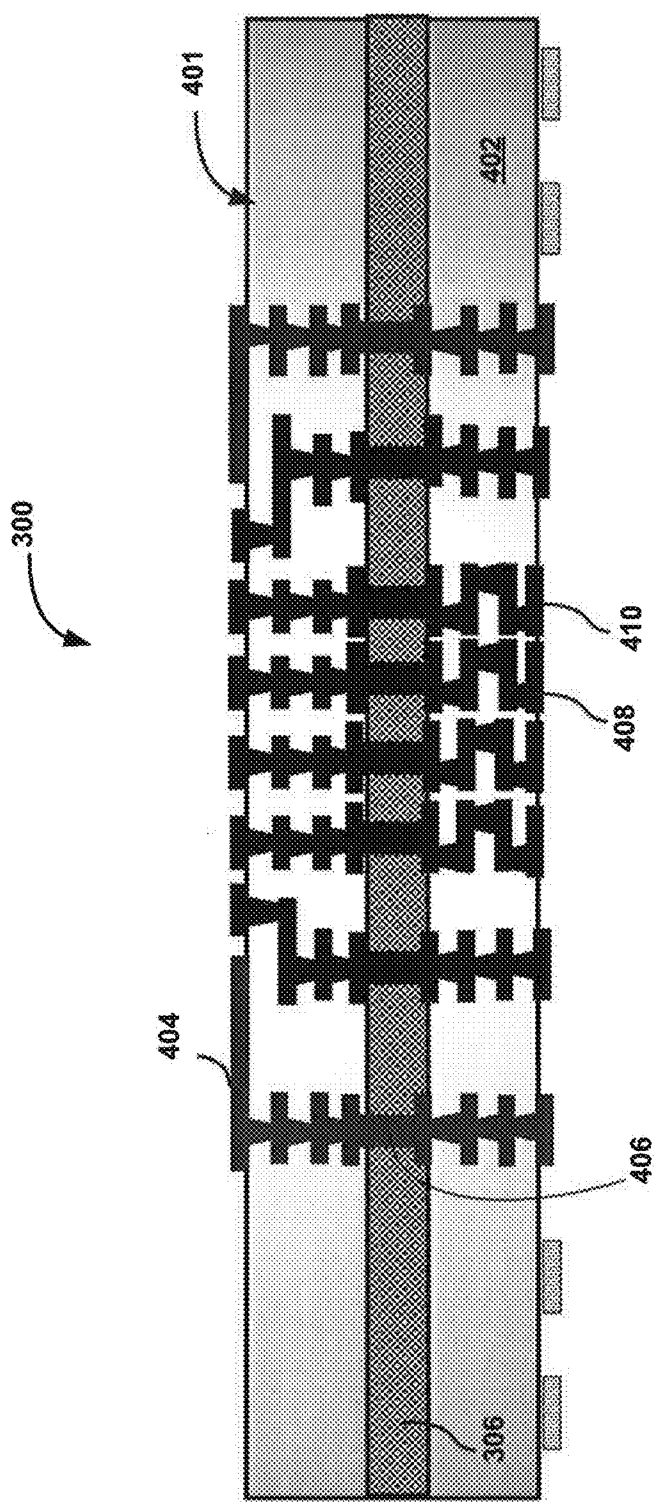

FIG. 4 illustrates the example system after build-up layers and ACI structures have been formed on the semiconductor package. Package interconnection may be established via repetition of drilling, photolithography, etching, dielectric lamination, and electroplating process of a substrate. As shown, the package substrate 401 may comprise a dielectric layer 402 and core layer 306, similar to the substrate of the package 100 of FIG. 1. The interconnect structure (similar to 120 of FIG. 1) may comprise metal routing 404 and a plated through hole (PTH) 406. The ACI structures 408, 410 (similar to 126, 128) may be formed using similar techniques.

Figure 5:
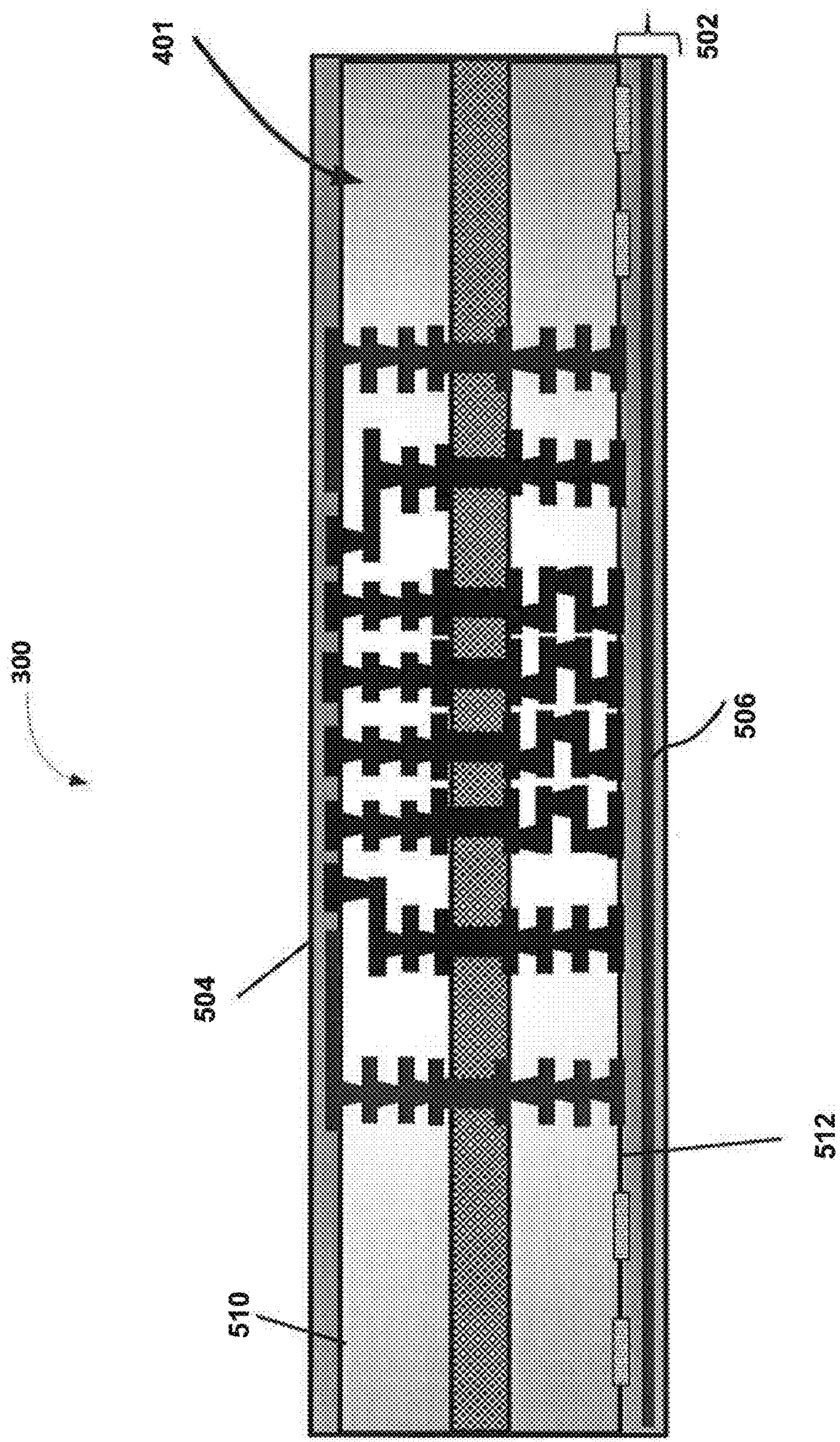

FIG. 5 illustrates the example system after solder resist layers have been formed in the semiconductor package 300. The resist layers 502, 504 may be adhered on the surfaces 510, 512 of the package build-up layers via lamination and hot-press process, for example. As shown, a solder resist layer 502 with embedded metal layer 506 (similar to voltage reference plane 112 of FIG. 1) may comprise a preformed solder resist with embedded metal layer, e.g., solder resist coating on a metal foil (through example spraying, printing or lamination process).

Figure 6:
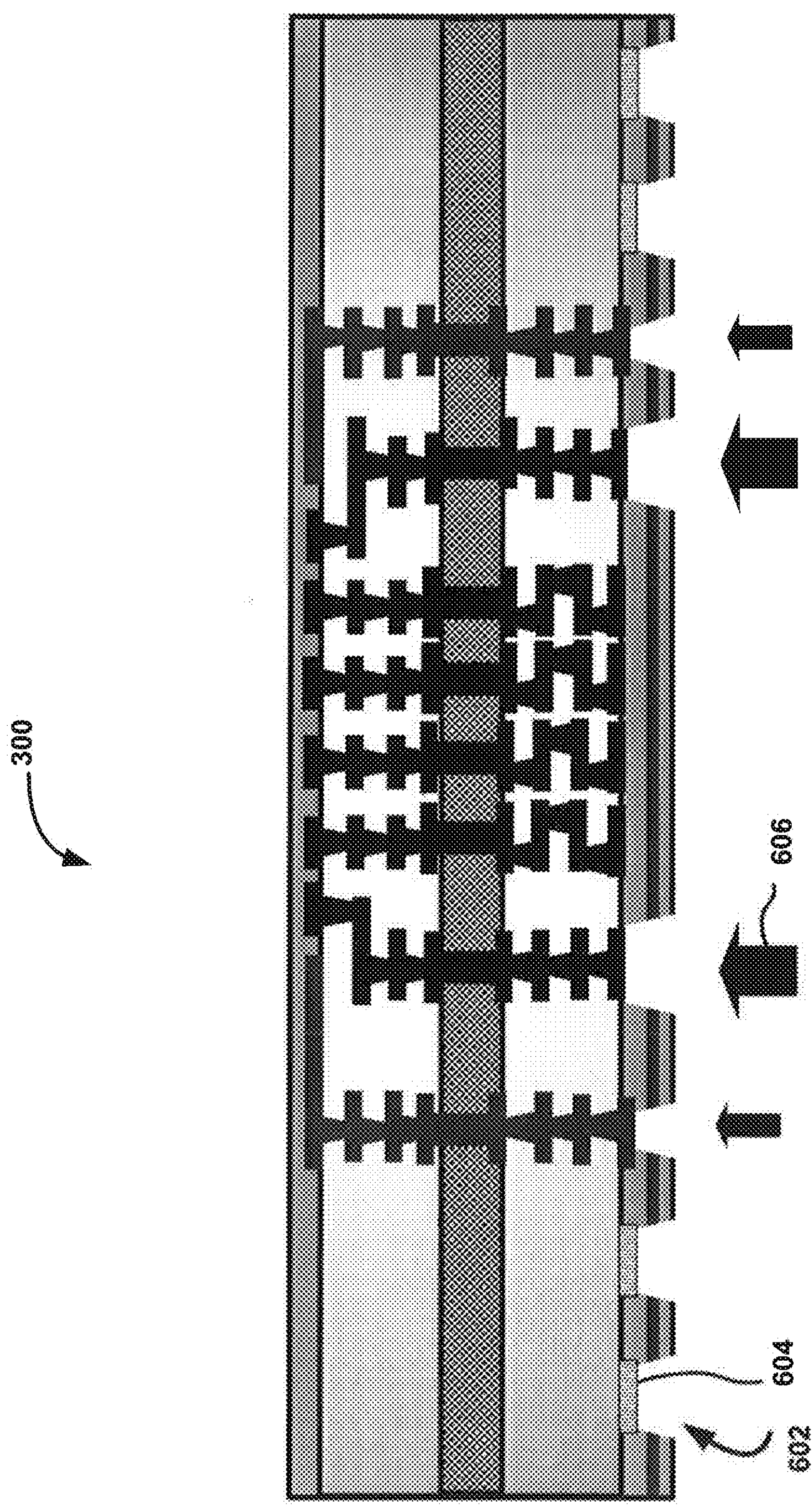

FIG. 6 illustrates the example system after via holes on the solder resist layer with the reference plane have been formed in the semiconductor package 300. As shown, the via holes 602 may include contact pads 604. The contact pads 604 may be provided by exposure through solder resist layer 502 and metal layer (reference plane) 506 using a laser and/or ultra-violet (UV) drilling process indicated by arrows 606. As shown in FIG. 6, various dimensions of resist layer opening may be formed on the resist layer 502. For example, larger resist layer opening (e.g., ranging from 350 μm to 450 μm) may be applied on contact pads associate to signal and/or power interconnects routing. In one embodiment, smaller resist layer opening (e.g., ranging from 100 μm to 150 μm) may be formed on contact pads associate to Vss reference plane and/or source, for example.

Figure 7:
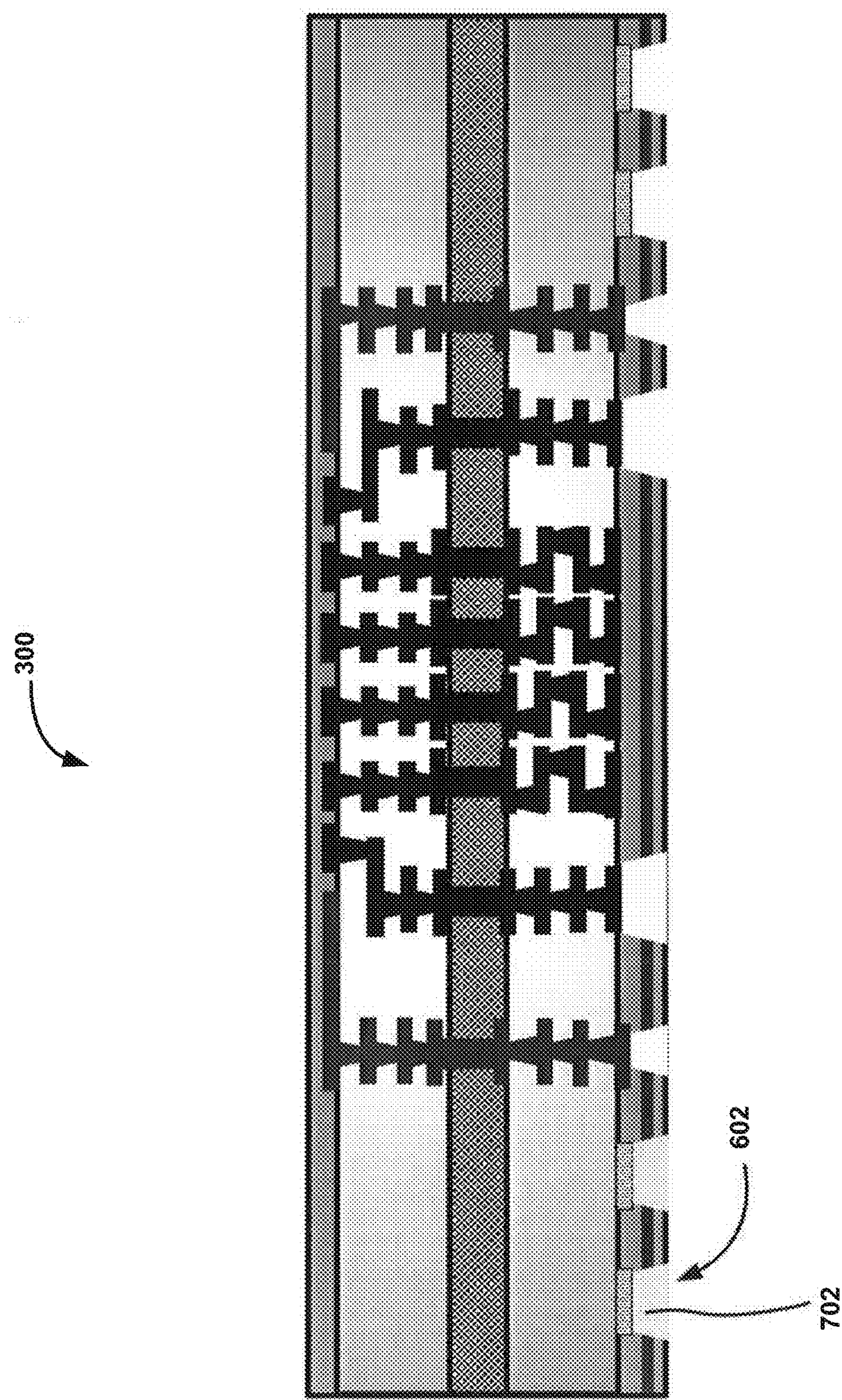

FIG. 7 illustrates the example system after via holes are filled with dielectric material in the semiconductor package 300. The dielectric material 702 may be disposed within the via holes 602 through a coating, lamination, and/or dispensing process.

Figure 8:
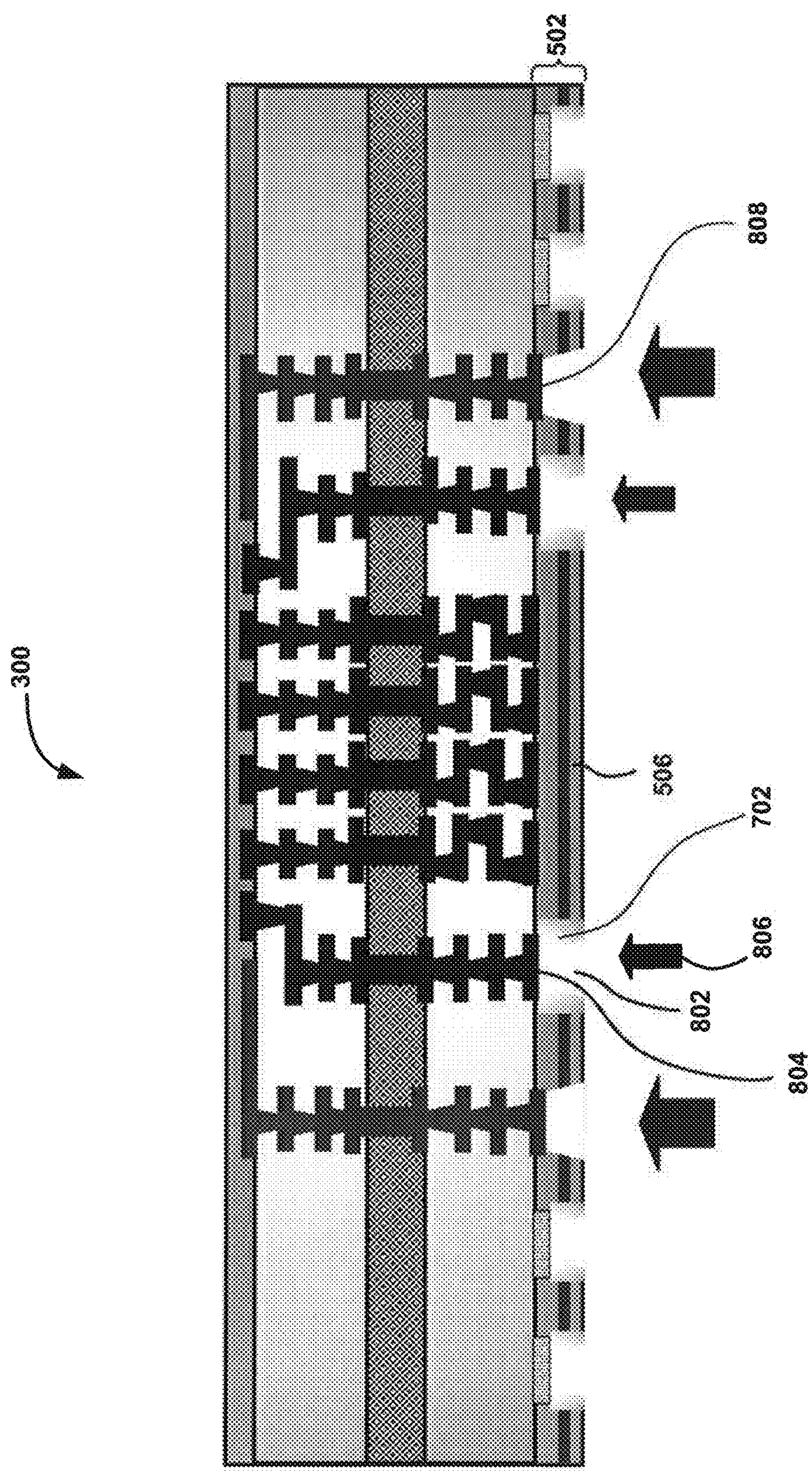

FIG. 8 illustrates the example system after solder resist openings associated to respective signal (Vcc and/or Vss) interconnect paths on the solder resist layer with the voltage reference plane have been formed in the semiconductor package 300. As shown, the conductive portion of the embedded reference plane 506 may be isolated from via holes 802 and contact pad 804 through dielectric layer 702 using laser and/or UV drilling process 806, for example. As shown in FIG. 8, various dimensions of drill diameter may be applied on the resist layer 502 to form the solder resist openings associated to respective signal, Vcc and/or Vss interconnect paths. For example, larger drill diameter (e.g., ranging from 250 μm to 400 μm) may be applied on contact pads associate to Vss reference plane and/or interconnects (e.g. contact pad 808). This way, the dielectric material 702 deposited on the contact pads and/or within solder resist openings associate to the Vss reference plane and/or interconnects during process shown in FIG. 7 may be removed. In an embodiment, smaller drill diameter (e.g., ranging from 300 μm to 400 μm) may be applied on contact pads associate to signal and/or power (Vcc) interconnects routing (e.g. contact pad 804). At least partial of the dielectric material 702 deposited on the contact pads and/or within solder resist openings associate to the signal and/or power (Vcc) interconnects during process shown in FIG. 7 may be preserved.

Figure 9:
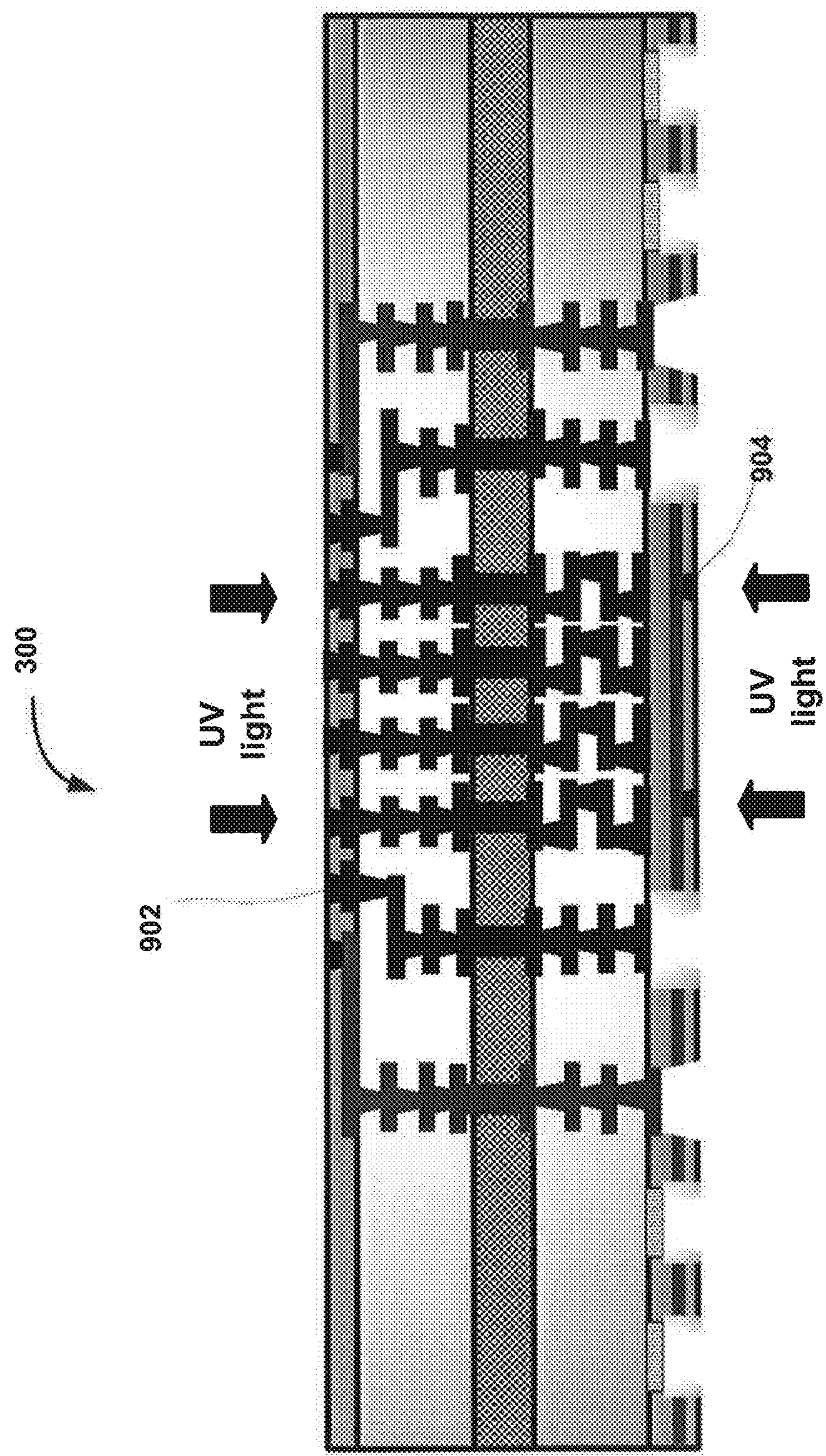

FIG. 9 illustrates the example system after the solder resist development and surface finish on the semiconductor package 300. As shown, bump pads 902 and land side capacitor (LSC) Vss pads 904 may be exposed via a photolithography and etching process. In an embodiment, one or more surface finish metal layers e.g., gold (Au), nickel-palladium-gold (NiPdAu) may be deposited on bump pads 902 and LSC Vss pads 904 to prevent metal oxidation through example electroplating process.

Figure 10:
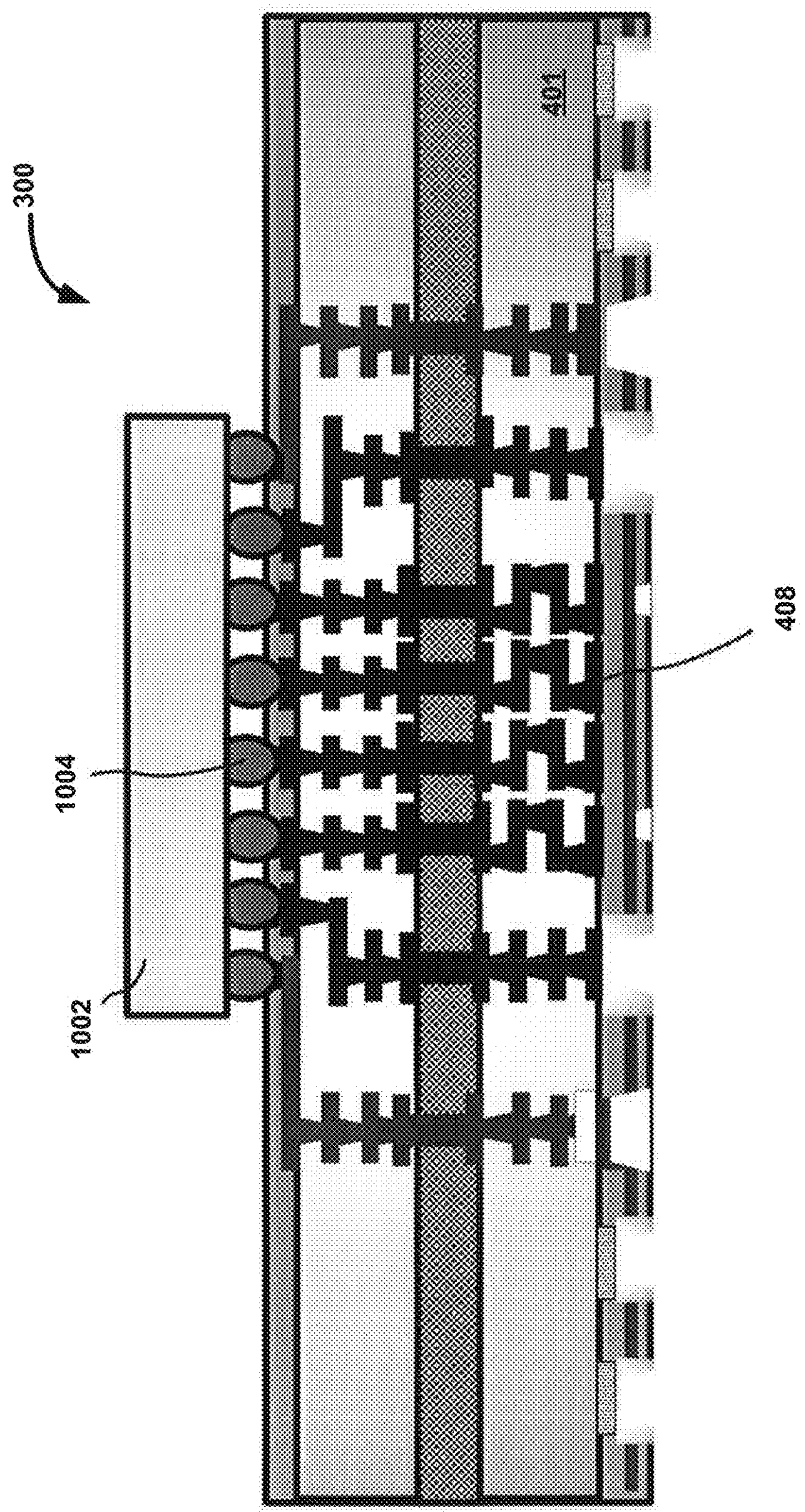

FIG. 10 illustrates the example system after a silicon die has been attached to the package substrate in the semiconductor package 300. As shown, electrical connections between the die 1002 and package substrate 401 may be provided via a reflow and surface mounting process. Bumps 1004 (e.g., controlled collapsed chip connection or C4 bumps) may provide the electrical connections between the die 1002 and corresponding components (e.g., ACI structure 408).

Figure 11:
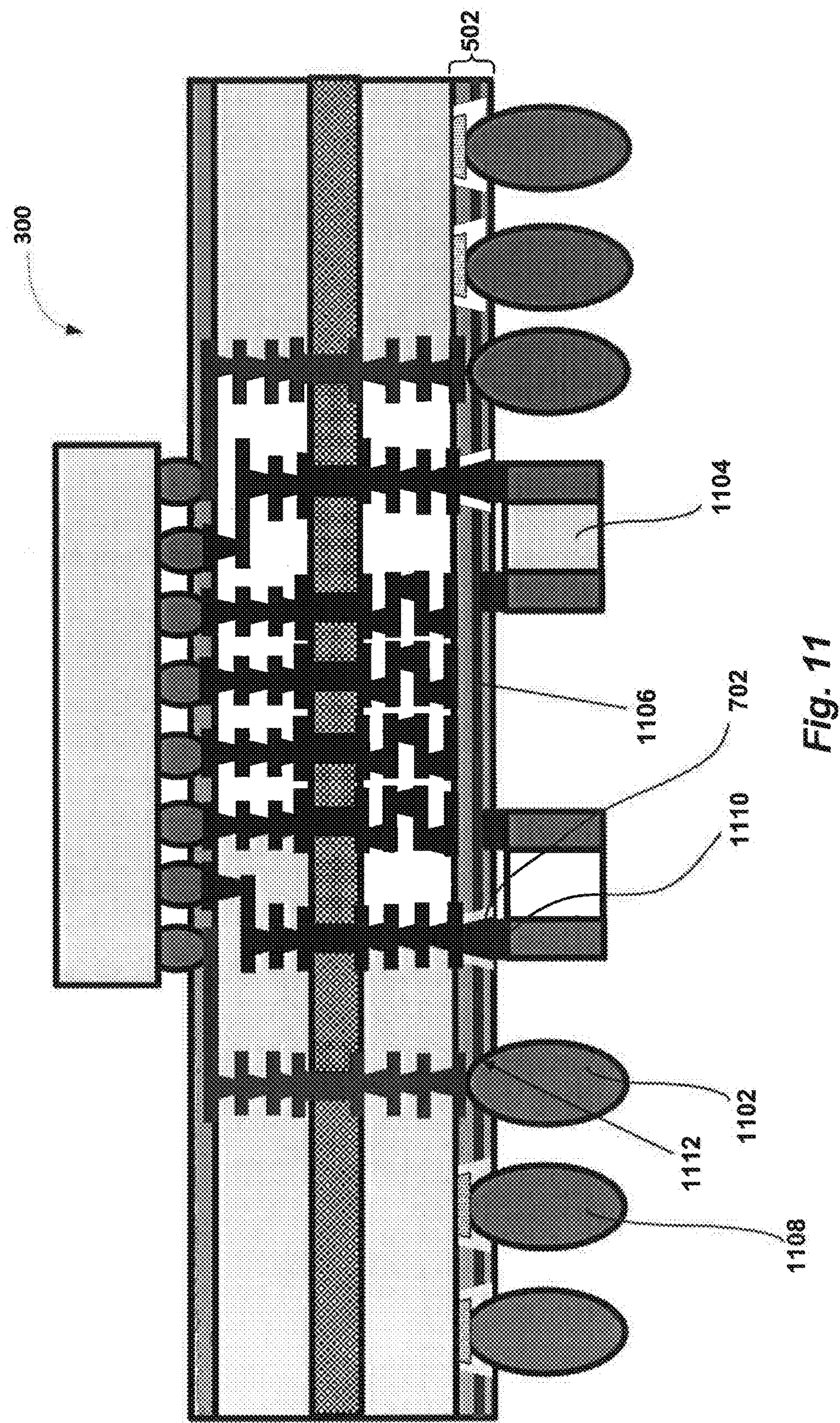

FIG. 11 illustrates the example system after the solder balls and package components (e.g., passive components) have been attached to the bottom side of the semiconductor package 300. Electrical connections between solder balls 1102 and passive components (capacitors) 1104, and the package 300 may be provided via a reflow and surface mounting process. The resulting package 300 depicted in FIG. 11 is similar to the semiconductor package 100 described in reference to FIGS. 1-2. As shown, connectors associated to signal path (e.g. solder ball 1108) and/or power (Vcc) interconnects (e.g. solder connection 1110) are isolated from the Vss or ground reference plane 1106 in solder resist layer 502 through dielectric layer 702. The connectors associated to the Vss reference plane or source (e.g., solder ball 1102) are electrically coupled to the embedded reference plane 1106 through conductive portions 1112 extended around the sidewalls of the solder resist openings in solder resist layer 502.

Figure 12:
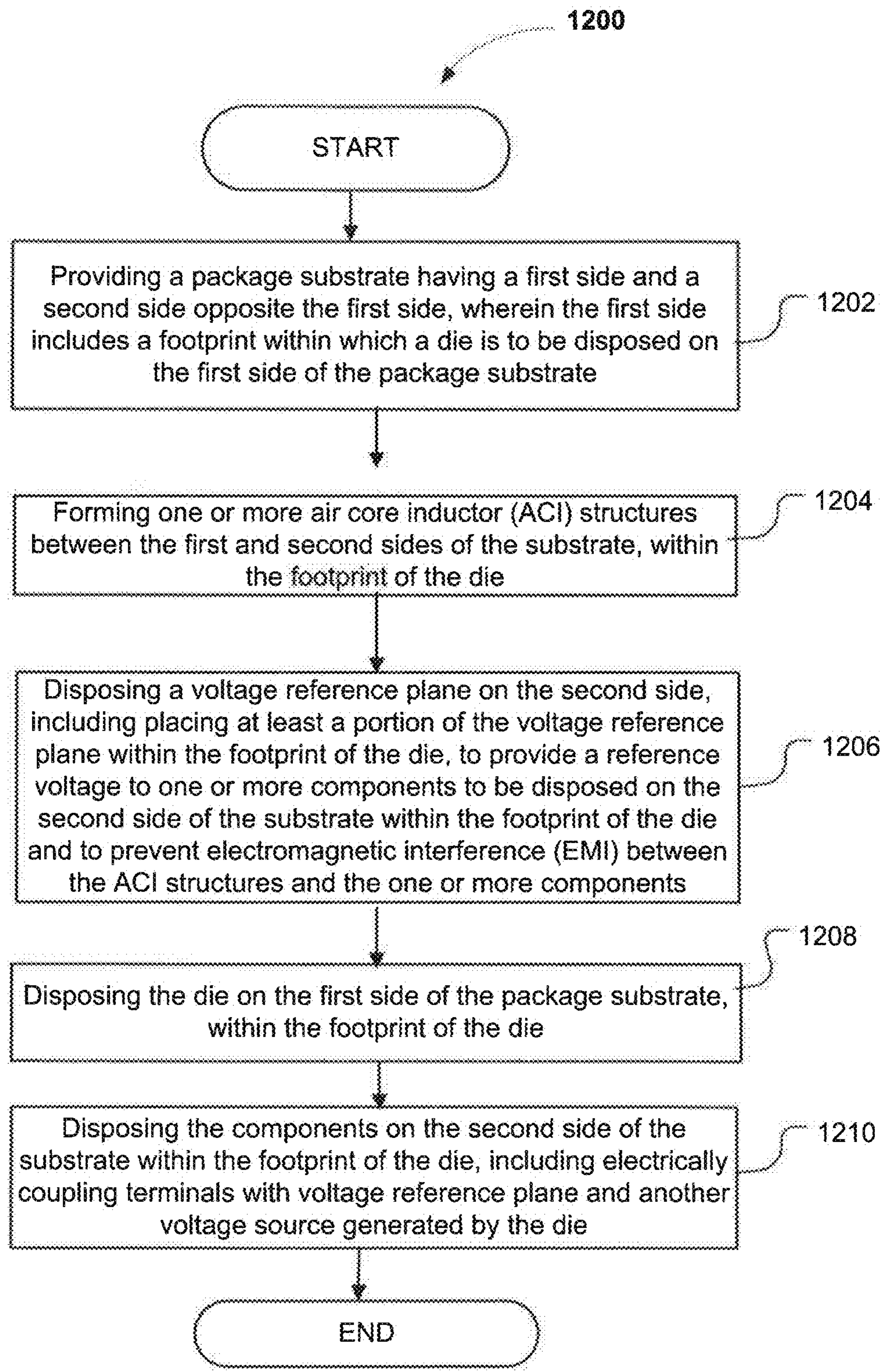
FIG. 12 is an example process flow diagram for providing a semiconductor package configured to provide for a disposition of one or more package components on a package substrate within a footprint of a package die, in accordance with some embodiments.

FIG. 12 is an example process flow diagram for providing a semiconductor package configured to provide for a disposition of one or more package components on a package substrate within a footprint of a package die, in accordance with some embodiments. The process 1200 may comport with embodiments described in reference to FIGS. 1-11. The actions described in the process 1200 may occur in a different order or in parallel; the order provided below is for purposes of illustration and does not limit this disclosure.

The process 1200 may begin at block 1202 and include providing a package substrate having a first side and a second side opposite the first side, wherein the first side includes a footprint within which a die is to be disposed on the first side of the package substrate.

At block 1204, the process 1200 may include forming one or more air core inductor (ACI) structures between the first and second sides of the substrate, within the footprint of the die.

At block 1206, the process 1200 may include disposing a voltage reference plane on the second side. This may include placing at least a portion of the voltage reference plane within the footprint of the die, to provide electromagnetic shielding and a reference voltage to one or more components to be disposed on the second side of the substrate within the footprint of the die and to prevent EMI between the ACI structures and the components to be disposed on the second side of the substrate.

In embodiments, disposing a voltage reference plane on the second side may include forming a dielectric layer on the second side of the package substrate. The dielectric layer may include the voltage reference plane embedded inside the dielectric layer. Disposing a voltage reference plane on the second side may further include providing one or more conductive paths from the die through the package substrate to the voltage reference plane, to supply the reference voltage generated by the die to the voltage reference plane.

At block 1208, the process 1200 may include disposing the die on the first side of the package substrate, within the footprint of the die.

At block 1210, the process 1200 may include disposing the components on the second side of the substrate within the footprint of the die. This may include electrically coupling terminals with the voltage reference plane and another voltage source generated by the die.

Figure 13:
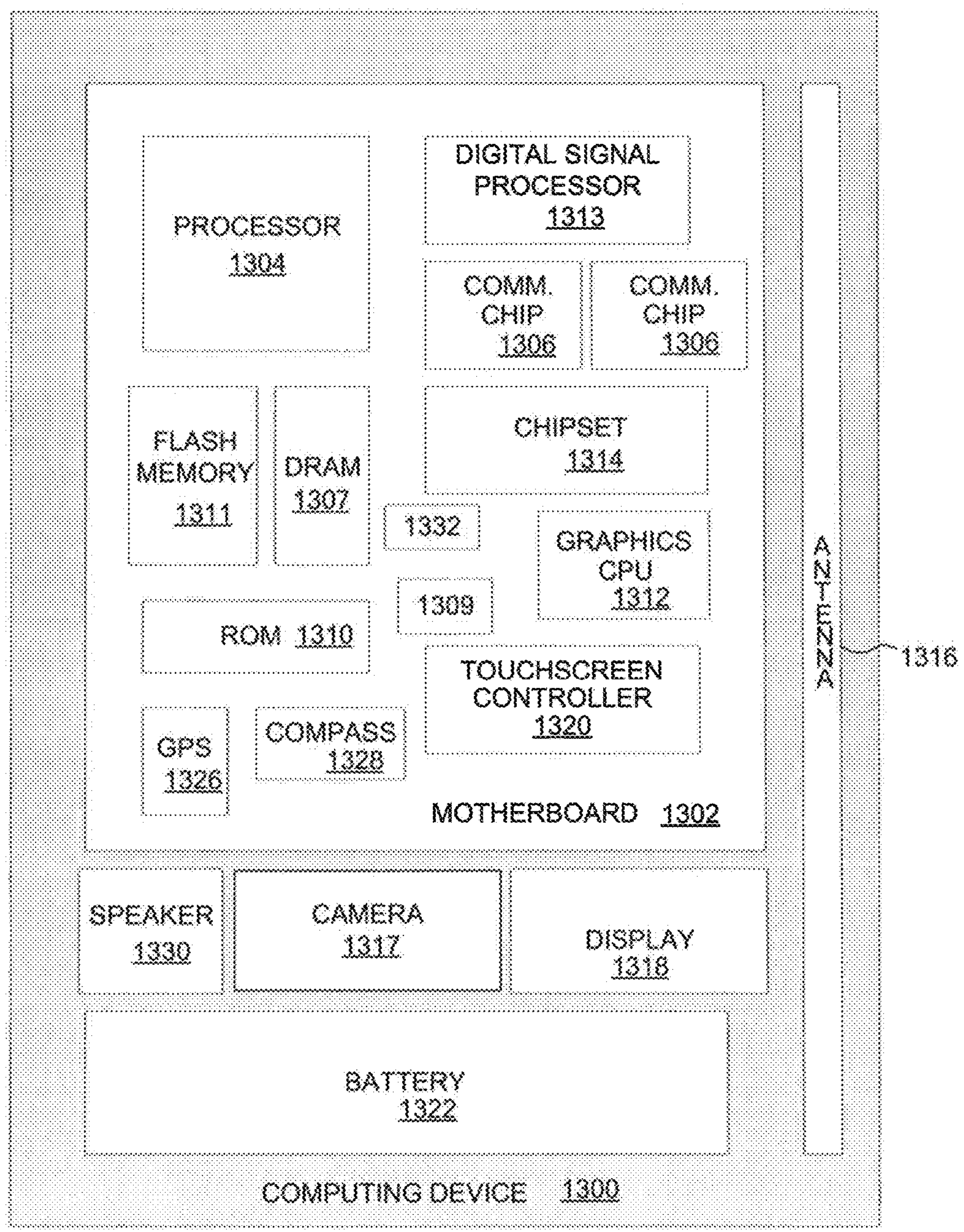
FIG. 13 illustrates an example computing device that may employ the apparatuses described herein, in accordance with some embodiments.

FIG. 13 illustrates an example computing device that may employ the apparatuses described herein, in accordance with some embodiments. For example, the computing device 1300 may include semiconductor packages, such as 100 or 300 assembled as described herein.

The motherboard 1302 may include a number of components, including but not limited to a processor 1304 and at least one communication chip 1306. In embodiments, the processor 1304 and other components (e.g., chip 1306) may comprise the package 100 of FIGS. 1-2 or package 300 of FIGS. 3-11. The processor 1304 may be physically and electrically coupled to the motherboard 1302. In some implementations, the communication chip 1306 may also be physically and electrically coupled to the motherboard 1302. In further implementations, the communication chip 1306 may be part of the processor 1304. Depending on its applications, the computing device 1300 may include other components that may or may not be physically and electrically coupled to the motherboard 1302 and may or may not comprise the package 100. Some of these components are shown in FIG. 13 for purposes of explanation. These other components may include, but are not limited to, volatile memory (e.g., dynamic random-access memory (DRAM)) 1307, static random access memory (SRAM) 1309, non-volatile memory (e.g., read-only memory (ROM)) 1310, flash memory 1311, a graphics central processing unit (CPU) 1312, a digital signal processor 1313, a chipset 1314, a display (e.g., a touchscreen display) 1318, a touchscreen controller 1320, a battery 1322, an audio codec, a video codec, a power amplifier (not shown), a global positioning system (GPS) device 1326, a compass 1328, a Geiger counter, an accelerometer, a gyroscope (not shown), a speaker 1330, a camera 1317, and a mass storage device 1332. These components may be included in IC packages, e.g., the package 100.

The communication chip 1306 may enable wireless communications for the transfer of data to and from the computing device 1300. The communication chip 1306 may implement any of a number of wireless standards or protocols, including but not limited to Institute for Electrical and Electronic Engineers (IEEE) standards including Wi-Fi (IEEE 802.7 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards.

The communication chip 1306 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1306 may operate in accordance with other wireless protocols in other embodiments.

The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, EV-DO, and others.

In addition, the computing device 1300 may further include an antenna 1316.

In various implementations, the computing device 1300 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

The embodiments described herein may be further illustrated by the following examples.

Example 1 may be an apparatus, comprising: a package substrate having a first side and a second side opposite the first side, wherein an area of the first side of the package substrate within which a die is to be disposed forms a footprint of the die; and a voltage reference plane coupled with the second side of the package substrate, wherein at least a portion of the voltage reference plane is disposed within the footprint of the die, to provide a reference voltage to one or more components to be disposed within the footprint of the die on the second side of the substrate.

Example 2 may include the apparatus of example 1, further comprising one or more air core inductor (ACI) structures disposed inside the package substrate within the footprint of the die, and extended substantially between the first and second sides of the substrate.

Example 3 may include the apparatus of example 2, further comprising a dielectric layer disposed on the second side of the package substrate, wherein the voltage reference plane is embedded in the dielectric layer.

Example 4 may include the apparatus of example 3, wherein the one or more ACI structures are isolated from the voltage reference plane with a portion of the dielectric layer disposed between the voltage reference plane and the second side of the package substrate.

Example 5 may include the apparatus of example 3, wherein the dielectric layer comprises a solder resist.

Example 6 may include the apparatus of example 3, wherein the reference voltage of the voltage reference plane is a first voltage generated by the die, wherein the apparatus includes one or more conductive paths disposed between the first and second sides of the substrate within the footprint of the die to provide a second voltage generated by the die to the one or more components to be disposed on the second side of the substrate within the footprint of the die.

Example 7 may include the apparatus of example 6, wherein the one or more conductive paths extend to a side of the dielectric layer that is disposed on the second side of the substrate, wherein the one or more conductive paths are isolated from the voltage reference plane.

Example 8 may include the apparatus of example 6, wherein the first and second voltages have opposite polarities.

Example 9 may include the apparatus of example 6, wherein one of the first and second voltages comprises a collector supply voltage (Vcc), and another one of the first and second voltages comprises a source supply voltage (Vss).

Example 10 may include the apparatus of example 6, wherein one or more conductive paths comprise first conductive paths, wherein the one or more components comprise first components, wherein the apparatus includes one or more second conductive paths disposed between the first and second sides of the substrate outside of the footprint of the die to provide the first voltage generated by the die to one or more second components to be coupled with the second side of the substrate outside of the footprint of the die, wherein the one or more second conductive paths are electrically coupled with the voltage reference plane to provide the first voltage to the voltage reference plane.

Example 11 may include the apparatus of example 10, wherein the first and second components comprise passive or active components, wherein the passive components include one or more capacitors.

Example 12 may include the apparatus of example 1, wherein the voltage reference plane is to shield the one or more components from electromagnetic interference.

Example 13 may be a system, comprising: a package substrate having a first side and a second side opposite the first side; a die disposed on the first side of the package substrate, wherein an area of the first side of the substrate to receive the die forms a footprint within which a die is disposed; one or more components disposed within the footprint of the die on the second side of the substrate; and a voltage reference plane attached to the second side of the package substrate, wherein at least a portion of the voltage reference plane is disposed within the footprint of the die, to provide a reference voltage to the one or more components.

Example 14 may include the system of example 13, further comprising one or more air core inductor (ACI)

structures electrically coupled with the die and disposed between the first and second sides of the substrate, within the footprint of the die, wherein the voltage reference plane is to prevent electromagnetic interference (EMI) between the ACI structures and the one or more components.

Example 15 may include the system of example 13, further comprising a dielectric layer disposed on the second side of the package substrate, wherein the voltage reference plane is embedded in the dielectric layer.

Example 16 may include the system of example 13, wherein the reference voltage of the voltage reference plane is a first voltage, wherein the system includes one or more conductive paths disposed between the first and second sides of the substrate within the footprint of the die to provide a second voltage generated by the die to the one or more components to be disposed on the second side of the substrate within the footprint of the die, wherein the one or more conductive paths are isolated from the voltage reference plane.

Example 17 may include the system of example 13, wherein the one or more components comprise passive or active components, wherein the passive components include one or more capacitors.

Example 18 may include the system of example 13, wherein the die comprises one or more of: a central processing unit (CPU), a platform controller hub (PCH), an embedded dynamic random access memory (eDRAM), or a field programmable gate array (FPGA), and wherein the system comprises a computing device.

Example 19 may include the system of example 15, wherein the dielectric layer comprises a first dielectric layer, wherein the system further comprises a second dielectric layer disposed on the first side of the package substrate, wherein the die is coupled with the first side of the package substrate via one or more solder bumps disposed on the first side and extending inside the second dielectric layer, wherein the die is electrically coupled to the one or more components via the solder bumps and further via one or more of: package traces or vertical interconnects electrically coupled with the solder bumps.

Example 20 may include the system of example 19, wherein the system comprises a semiconductor package.

Example 21 may be a method, comprising: providing a package substrate having a first side and a second side opposite the first side, wherein an area of the first side of the package substrate within which a die is to be disposed forms a footprint of the die; forming one or more air core inductor (ACI) structures between the first and second sides of the substrate, within the footprint of the die; and disposing a voltage reference plane on the second side, including placing at least a portion of the voltage reference plane within the footprint of the die, to provide a reference voltage to one or more components to be disposed within the footprint of the die on the second side of the substrate and to prevent electromagnetic interference (EMI) between the ACI structures and the one or more components.

Example 22 may include the method of example 21, further comprising: disposing the die within the footprint of the die on the first side of the package substrate.

Example 23 may include the method of example 21, wherein disposing a voltage reference plane on the second side includes: forming a dielectric layer on the second side of the package substrate, the dielectric layer including the voltage reference plane embedded inside the dielectric layer; and providing one or more conductive paths from the die through the package substrate to the voltage reference plane, to supply the reference voltage generated by the die to the voltage reference plane.

Example 24 may include the method of example 23, further comprising: disposing the one or more components on the second side of the substrate within the footprint of the die; and electrically coupling a terminal of the one or more components with the voltage reference plane.

Example 25 may include the method of example 24, wherein one or more conductive paths comprise first conductive paths, wherein the reference voltage of the voltage reference plane is a first voltage generated by the die, wherein the method further comprises: disposing one or more second conductive paths between the first and second sides of the substrate within the footprint of the die to provide a second voltage generated by the die to the one or more components disposed on the second side of the substrate within the footprint of the die; isolating the one or more second conductive paths from the voltage reference plane; and electrically coupling another terminal of the one or more components with the one or more second conductive paths.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

The invention claimed is:

1. An apparatus, comprising:

a package substrate having a first side and a second side opposite the first side, wherein an area of the first side of the package substrate within which a die is to be disposed forms a footprint of the die;

a voltage reference plane coupled with the second side of the package substrate, wherein at least a portion of the voltage reference plane is disposed within the footprint of the die, to provide a reference voltage to one or more components to be disposed within the footprint of the die on the second side of the substrate, and to shield the one or more components from electromagnetic interference; and one or more air core inductor (ACI) structures disposed inside the package substrate within the footprint of the die, and extended substantially between the first and second sides of the substrate.

2. The apparatus of claim 1, further comprising a dielectric layer disposed on the second side of the package substrate, wherein the voltage reference plane is embedded in the dielectric layer.

3. The apparatus of claim 2, wherein the one or more ACI structures are isolated from the voltage reference plane with a portion of the dielectric layer disposed between the voltage reference plane and the second side of the package substrate.

4. The apparatus of claim 2, wherein the dielectric layer comprises a solder resist.

5. The apparatus of claim 2, wherein the reference voltage of the voltage reference plane is a first voltage generated by the die, wherein the apparatus includes one or more conductive paths disposed between the first and second sides of the substrate within the footprint of the die to provide a second voltage generated by the die to the one or more components to be disposed on the second side of the substrate within the footprint of the die.

6. The apparatus of claim 5, wherein the one or more conductive paths extend to a side of the dielectric layer that is disposed on the second side of the substrate, wherein the one or more conductive paths are isolated from the voltage reference plane.

7. The apparatus of claim 5, wherein the first and second voltages have opposite polarities.

8. The apparatus of claim 5, wherein one of the first and second voltages comprises a collector supply voltage (Vcc), and another one of the first and second voltages comprises a source supply voltage (Vss).

9. The apparatus of claim 5, wherein one or more conductive paths comprise first conductive paths, wherein the one or more components comprise first components, wherein the apparatus includes one or more second conductive paths disposed between the first and second sides of the substrate outside of the footprint of the die to provide the first voltage generated by the die to one or more second components to be coupled with the second side of the substrate outside of the footprint of the die, wherein the one or more second conductive paths are electrically coupled with the voltage reference plane to provide the first voltage to the voltage reference plane.

10. The apparatus of claim 9, wherein the first and second components comprise passive or active components, wherein the passive components include one or more capacitors.

11. The system of claim 10, further comprising a dielectric layer disposed on the second side of the package substrate, wherein the voltage reference plane is embedded in the dielectric layer.

12. The system of claim 10, wherein the reference voltage of the voltage reference plane is a first voltage, wherein the system includes one or more conductive paths disposed between the first and second sides of the substrate within the footprint of the die to provide a second voltage generated by the die to the one or more components to be disposed on the second side of the substrate within the footprint of the die, wherein the one or more conductive paths are isolated from the voltage reference plane.

13. The system of claim 10, wherein the one or more components comprise passive or active components, wherein the passive components include one or more capacitors.

14. The system of claim 10, wherein the die comprises one or more of: a central processing unit (CPU), a platform controller hub (PCH), an embedded dynamic random access memory (eDRAM), or a field programmable gate array (FPGA), and wherein the system comprises a computing device.

15. The system of claim 11, wherein the dielectric layer comprises a first dielectric layer, wherein the system further comprises a second dielectric layer disposed on the first side of the package substrate, wherein the die is coupled with the first side of the package substrate via one or more solder bumps disposed on the first side and extending inside the second dielectric layer, wherein the die is electrically coupled to the one or more components via the solder bumps and further via one or more of: package traces or vertical interconnects electrically coupled with the solder bumps.

16. The system of claim 15, wherein the system comprises a semiconductor package.

17. A system, comprising:

a package substrate having a first side and a second side opposite the first side;

a die disposed on the first side of the package substrate, wherein an area of the first side of the substrate to receive the die forms a footprint within which a die is disposed;

one or more components disposed within the footprint of the die on the second side of the substrate;

a voltage reference plane attached to the second side of the package substrate, wherein at least a portion of the voltage reference plane is disposed within the footprint of the die, to provide a reference voltage to the one or more components; and one or more air core inductor (ACI) structures electrically coupled with the die and disposed between the first and second sides of the substrate, within the footprint of the die, wherein the voltage reference plane is to prevent electromagnetic interference (EMI) between the ACI structures and the one or more components.

18. A method, comprising:

providing a package substrate having a first side and a second side opposite the first side, wherein an area of the first side of the package substrate within which a die is to be disposed forms a footprint of the die;

forming one or more air core inductor (ACI) structures between the first and second sides of the substrate, within the footprint of the die; and disposing a voltage reference plane on the second side, including placing at least a portion of the voltage reference plane within the footprint of the die, to provide a reference voltage to one or more components to be disposed within the footprint of the die on the second side of the substrate and to prevent electromagnetic interference (EMI) between the ACI structures and the one or more components.

19. The method of claim 18, further comprising: disposing the die within the footprint of the die on the first side of the package substrate.

20. The method of claim 18, wherein disposing a voltage reference plane on the second side includes:

forming a dielectric layer on the second side of the package substrate, the dielectric layer including the voltage reference plane embedded inside the dielectric layer; and providing one or more conductive paths from the die through the package substrate to the voltage reference plane, to supply the reference voltage generated by the die to the voltage reference plane.

21. The method of claim 20, further comprising:

disposing the one or more components on the second side of the substrate within the footprint of the die; and electrically coupling a terminal of the one or more components with the voltage reference plane.

22. The method of claim 21, wherein one or more conductive paths comprise first conductive paths, wherein the reference voltage of the voltage reference plane is a first voltage generated by the die, wherein the method further comprises:

disposing one or more second conductive paths between the first and second sides of the substrate within the footprint of the die to provide a second voltage generated by the die to the one or more components disposed on the second side of the substrate within the footprint of the die;

isolating the one or more second conductive paths from the voltage reference plane; and electrically coupling another terminal of the one or more components with the one or more second conductive paths.

* * * * *